(12) United States Patent
Meyer et al.

(10) Patent No.: US 10,157,869 B2
(45) Date of Patent: Dec. 18, 2018

(54) INTEGRATED CIRCUIT PACKAGE

(71) Applicant: Intel Corporation, Santa Clara, CA (US)

(72) Inventors: Thorsten Meyer, Regensburg (DE); Gerald Ofner, Regensburg (DE); Teodora Ossiander, Sinzing (DE); Frank Zudock, Regensburg (DE); Christian Geissler, Teugn (DE)

(73) Assignee: Intel Corporation, Santa Clara, CA (US)

( * ) Notice: Subject to any disclaimer, the term of this patent is extended or adjusted under 35 U.S.C. 154(b) by 13 days.

(21) Appl. No.: 15/294,499

(22) Filed: Oct. 14, 2016

(65) Prior Publication Data

US 2017/0103956 A1 Apr. 13, 2017

Related U.S. Application Data

(62) Division of application No. 14/205,093, filed on Mar. 11, 2014, now Pat. No. 9,472,515.

(51) Int. Cl.
| | |
|---|---|
| *H01L 21/00* | (2006.01) |
| *H01L 23/00* | (2006.01) |
| *H01L 21/02* | (2006.01) |
| *H01L 21/311* | (2006.01) |
| *H01L 21/768* | (2006.01) |
| *H01L 23/525* | (2006.01) |

(52) U.S. Cl.
CPC ........ *H01L 24/11* (2013.01); *H01L 21/02282* (2013.01); *H01L 21/02318* (2013.01);
(Continued)

(58) Field of Classification Search
None
See application file for complete search history.

(56) References Cited

U.S. PATENT DOCUMENTS

| 5,242,864 A | 9/1993 | Fassberg et al. |
|---|---|---|
| 7,232,746 B2 | 6/2007 | Shim |

(Continued)

FOREIGN PATENT DOCUMENTS

| CN | 1232287 A | 10/1999 |
|---|---|---|
| JP | S6481181 A | 3/1989 |

(Continued)

OTHER PUBLICATIONS

Search Report dated Jan. 15, 2016 for Taiwanese Application No. 10410979, 2 pages.
(Continued)

*Primary Examiner* — Ali Naraghi
(74) *Attorney, Agent, or Firm* — Schwabe, Williamson & Wyatt, P.C.

(57) ABSTRACT

Embodiments of the present disclosure are directed towards a method of assembling an integrated circuit package. In embodiments the method may include providing a wafer having an unpatterned passivation layer to prevent corrosion of metal conductors embedded in the wafer. The method may further include laminating a dielectric material on the passivation layer to form a dielectric layer and selectively removing dielectric material to form voids in the dielectric layer. These voids may reveal portions of the passivation layer disposed over the metal conductors. The method may then involve removing the portions of the passivation layer to reveal the metal conductors. Other embodiments may be described and/or claimed.

10 Claims, 5 Drawing Sheets

(52) U.S. Cl.
CPC ....... *H01L 21/311* (2013.01); *H01L 21/31111* (2013.01); *H01L 21/31116* (2013.01); *H01L 21/7685* (2013.01); *H01L 21/76802* (2013.01); *H01L 21/76834* (2013.01); *H01L 21/76871* (2013.01); *H01L 24/02* (2013.01); *H01L 24/03* (2013.01); *H01L 24/05* (2013.01); *H01L 24/19* (2013.01); *H01L 23/525* (2013.01); *H01L 24/13* (2013.01); *H01L 24/16* (2013.01); *H01L 24/20* (2013.01); *H01L 24/81* (2013.01); *H01L 24/94* (2013.01); *H01L 2224/02311* (2013.01); *H01L 2224/02313* (2013.01); *H01L 2224/02331* (2013.01); *H01L 2224/0345* (2013.01); *H01L 2224/0361* (2013.01); *H01L 2224/0381* (2013.01); *H01L 2224/03462* (2013.01); *H01L 2224/03914* (2013.01); *H01L 2224/0401* (2013.01); *H01L 2224/05083* (2013.01); *H01L 2224/05144* (2013.01); *H01L 2224/05147* (2013.01); *H01L 2224/05164* (2013.01); *H01L 2224/05166* (2013.01); *H01L 2224/05171* (2013.01); *H01L 2224/05548* (2013.01); *H01L 2224/12105* (2013.01); *H01L 2224/131* (2013.01); *H01L 2224/13022* (2013.01); *H01L 2224/16227* (2013.01); *H01L 2224/211* (2013.01); *H01L 2224/8112* (2013.01); *H01L 2224/81191* (2013.01); *H01L 2224/81801* (2013.01); *H01L 2224/821* (2013.01); *H01L 2224/82105* (2013.01); *H01L 2224/94* (2013.01); *H01L 2924/01022* (2013.01); *H01L 2924/01024* (2013.01); *H01L 2924/01029* (2013.01); *H01L 2924/01046* (2013.01); *H01L 2924/01079* (2013.01); *H01L 2924/12042* (2013.01); *H01L 2924/143* (2013.01); *H01L 2924/181* (2013.01)

(56) References Cited

U.S. PATENT DOCUMENTS

| | | | |
|---|---|---|---|
| 7,633,165 B2 | 12/2009 | Hsu et al. | |
| 9,123,777 B2* | 9/2015 | Choi | H01L 21/76805 |
| 2003/0153172 A1 | 8/2003 | Yajima et al. | |
| 2004/0121606 A1 | 6/2004 | Raskin et al. | |
| 2008/0099913 A1 | 5/2008 | Lehr et al. | |
| 2008/0169539 A1* | 7/2008 | Fang | H01L 24/03 257/676 |
| 2009/0020884 A1* | 1/2009 | Lee | H01L 21/3105 257/774 |
| 2009/0045511 A1 | 2/2009 | Meyer et al. | |
| 2010/0072433 A1* | 3/2010 | Maeda | H01L 21/565 252/512 |
| 2010/0297842 A1 | 11/2010 | Ke et al. | |
| 2011/0006422 A1* | 1/2011 | Daubenspeck | H01L 24/05 257/738 |
| 2012/0049343 A1 | 3/2012 | Schulze et al. | |
| 2012/0129335 A1 | 5/2012 | Ikumo et al. | |
| 2012/0235278 A1 | 9/2012 | Shigihara et al. | |
| 2013/0171774 A1 | 7/2013 | Chen et al. | |
| 2013/0277841 A1 | 10/2013 | Lii et al. | |
| 2014/0054800 A1 | 2/2014 | Gatterbauer et al. | |
| 2014/0091471 A1 | 4/2014 | Chen et al. | |
| 2014/0252313 A1* | 9/2014 | Mariani | H01L 31/1884 257/21 |
| 2015/0076694 A1 | 3/2015 | Kuo | |
| 2015/0200203 A1* | 7/2015 | Jang | H01L 27/11582 257/324 |

FOREIGN PATENT DOCUMENTS

| | | |
|---|---|---|
| JP | 2011071547 A | 4/2011 |
| WO | WO2004102690 A3 | 11/2004 |

OTHER PUBLICATIONS

Office Action dated May 10, 2016 for Japanese Application No. 2015-012866, 16 pages.

Non-Final Office Action dated Jun. 4, 2015 for U.S. Appl. No. 14/205,093, 12 pages.

Non-Final Office Action dated Feb. 12, 2016 for U.S. Appl. No. 14/205,093, 6 pages.

Notice of Allowance dated Jun. 29, 2016 for U.S. Appl. No. 14/205,093, 20 pages.

* cited by examiner ed States Patent: US 10,157,869 B2

INTEGRATED CIRCUIT PACKAGE

RELATED APPLICATION

This is a division of U.S. patent application Ser. No. 14/205,093, entitled "INTEGRATED CIRCUIT PACKAGE," filed on Mar. 11, 2014, which is hereby incorporated by reference in its entirety for all purposes.

FIELD

Embodiments of the present disclosure generally relate to the field of integrated circuits (ICs), and more particularly, to reducing cost of IC package manufacturing as well as increasing reliability and consistency of package connections.

BACKGROUND

A complex series of operations may be used to produce an integrated circuit (IC) package. One of those operations is to apply a protective layer to a wafer and form openings in the protective layer in the silicon foundry as a part of back end of line (BEOL) processing. This may involve utilizing a resist material as a mask to form the openings and then, after the openings are formed, removal of the resist material, which may be a costly process. In addition, because the passivation layer is opened at the foundry, metal contacts, or pads, exposed by the openings need to be made of a material that does not readily oxidize. Furthermore, because the openings in the passivation layer may be formed prior to disposition of a dielectric layer, vias formed in the dielectric layer will not fully align with the openings in the passivation layer.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings. Unless clearly indicated otherwise, these drawings are not to scale. In addition, some portions of these drawings may be intentionally embellished in order to draw attention to features contained within the drawings.

DETAILED DESCRIPTION

Figure 1:
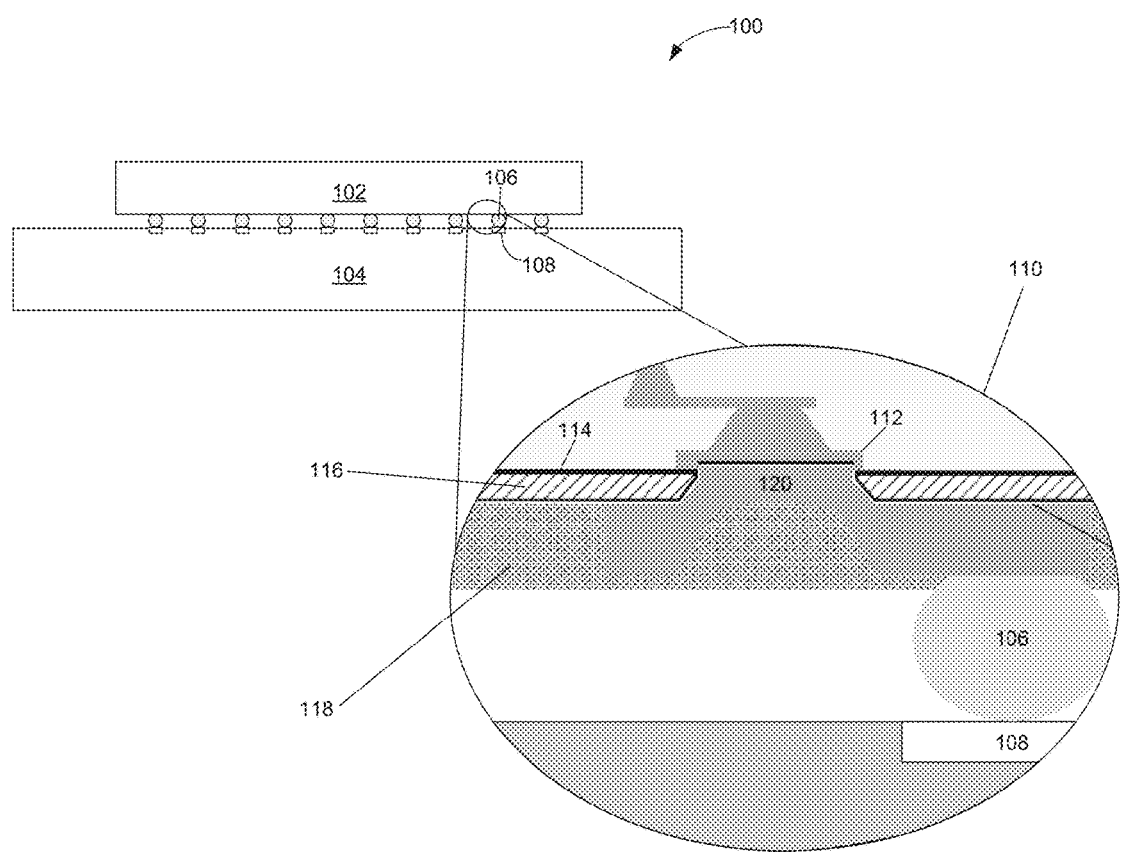
FIG. 1 schematically illustrates a cross-section side view of an example integrated circuit (IC) assembly, in accordance with some embodiments of the present disclosure.

Embodiments of the present disclosure describe techniques and configurations for a lower cost more reliable integrated circuit package assembly. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) assembly including IC package 102 electrically and physically coupled with circuit board 104, in accordance with embodiments of the present disclosure. In embodiments, the IC package 102 may be or include one or more dies that may be at least partially encapsulated in an encapsulation material.

In embodiments, IC package 102 may be a fan-in wafer level package or a fan-out wafer level package. In embodiments where IC package 102 is a fan-out wafer level package, one or more dies may be encapsulated in a molding compound that forms a fan-out area surrounding the one or more dies. Such a fan-out wafer level package may be produced by coupling a surface of the one or more dies to a carrier. The molding compound may be disposed over exposed surfaces of the one or more dies, those surfaces not coupled with the carrier. The molding compound may then be cured to harden the molding compound. After the molding compound is cured, the carrier may be decoupled from the one or more dies and a fan-out surface formed by the hardened molding compound. The fan-out surface of the hardened molding compound may be adjacent to, and form a perimeter around, the surface of the one or more dies that was coupled with the carrier.

In other embodiments, IC package 102 may be an embedded die package. In such embodiments, one or more dies may be encapsulated in lamination layers, that form a fan-out area surrounding the one or more dies. Such an embedded die package may be produced by coupling a surface of the one or more dies to a carrier. The lamination layers may be disposed over exposed surfaces of the one or more dies, those surfaces not coupled with the carrier. The lamination layers may then be pressed and cured to harden the lamination layers. After the curing, the lamination layers may embed the die and may be adjacent to, and form a perimeter around, the surface of the one or more dies that was coupled with the carrier.

In some embodiments, IC package 102 may have a redistribution layer (RDL), such as RDL 120 in inset 110. Redistribution layer 120 may be configured to electrically couple one or more metal pads 112 with one or more interconnect structures (e.g., solder balls 106). The interconnect structures may be configured to electrically and physically couple IC package 102 with a package substrate or circuit board (e.g., circuit board 104). The IC package 102 may be attached to circuit board 104 according to a variety of suitable configurations including a flip configuration. While depicted herein as solder balls 106, interconnect structures may include pillars, or other suitable structures in place of, or in addition to, solder balls 106 that may electrically couple the IC package 102 with circuit board 104. The IC package 102 may represent a discrete chip or die made from a semiconductor material and may be, include, or be a part of a processor, memory, or ASIC in some embodiments.

A portion of IC package 102 is shown in greater detail, in accordance with various embodiments, in inset 110. Inset 110 is a magnification of the portion of IC assembly 100 identified by the oval drawn on IC assembly 100. As can be seen in inset 110, IC package 102 may, in some embodiments, include a dielectric layer 116, a passivation layer 114, and a solder stop layer 118. The passivation layer 114 may be, for example, a layer of silicon nitride (SiN) or silicon oxide (SiO). The IC package 102 may also include a metallic pad 112 having a RDL 120 disposed thereon. In some embodiments, metallic pad 112 may be copper or a copper alloy. In some embodiments, under bump metallization may be used in place of RDL 120. As can be seen, RDL 120 may be disposed in a via formed in dielectric layer 116. Redistribution layer 116 may also be disposed in a void formed in passivation layer 114. In embodiments, the void in passivation layer 114 may be formed utilizing dielectric layer 116 as a mask. As such, the void in passivation layer 114 may be fully aligned with the via formed in dielectric layer 116, as depicted. In some embodiments, IC package 102 may be fabricated through the process described in reference to FIG. 2, below, and depicted in the cross-section views of such a fabrication process depicted in FIG. 3.

The circuit board 104 may be a printed circuit board (PCB) composed of an electrically insulative material such as an epoxy laminate. For example, the circuit board 104 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not depicted), such as vias, may be formed through the electrically insulating layers to route the electrical signals to or from IC package 102 through the circuit board 104. The circuit board 104 may be composed of other suitable materials in other embodiments. In some embodiments, the circuit board 104 may be a motherboard (e.g., motherboard 502 of FIG. 5).

Figure 2:
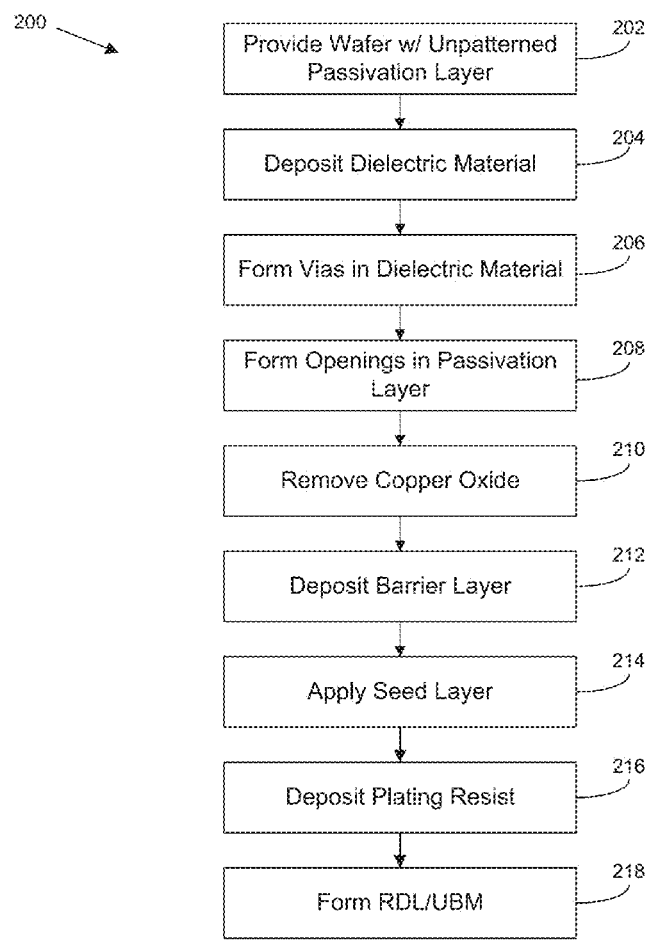
FIG. 2 is an illustrative flow diagram of an integrated circuit package fabrication process in accordance with some embodiments of the present disclosure.
Figure 3:
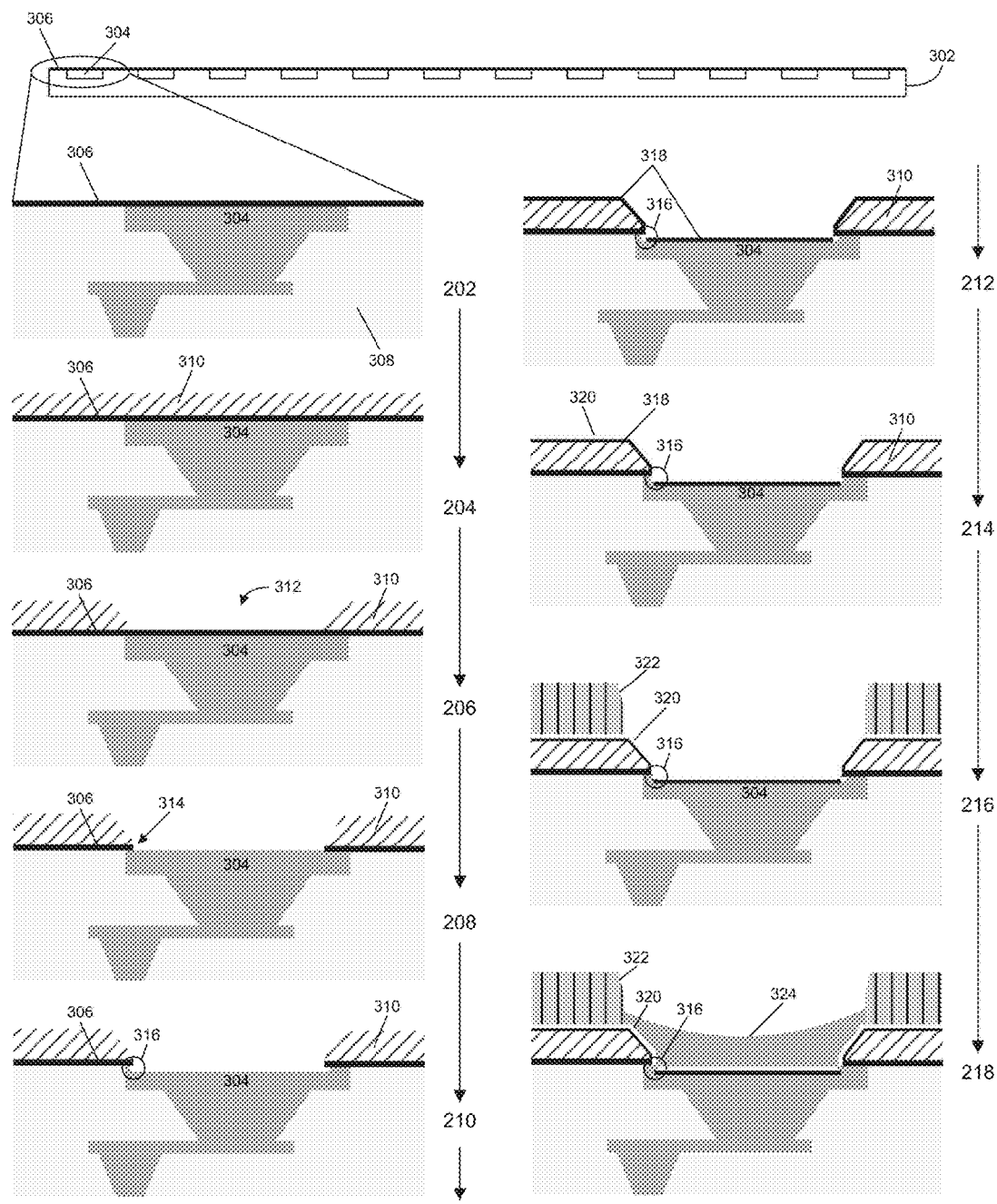
FIG. 3 is an illustrative cross-section view of selected operations illustrating stages in the integrated circuit package fabrication process described in FIG. 2, in accordance with some embodiments of the present disclosure.

FIG. 2 is an illustrative flow diagram of a fabrication process 200 for producing an IC package, such as IC package 102 of FIG. 1. FIG. 3 provides cross-section views of selected operations illustrating stages in the IC package fabrication process 200, in accordance with an illustrative embodiment. As a result, FIG. 2 and FIG. 3 will be described in conjunction with one another. To aid in this description, the operations performed in FIG. 2 are referenced on the arrows moving from operation to operation in FIG. 3. In addition, not all reference numbers are depicted in each operation in FIG. 3 in an effort to not overly complicate the depictions.

Process 200 may begin at operation 202 where a wafer (e.g., wafer 302 of FIG. 3) may be provided. In embodiments, wafer 302 may have a plurality of embedded metal conductors, (e.g., metal conductor 304 of FIG. 3) that may have a hard passivation layer (e.g., passivation layer 306) disposed on, and in direct contact with, a surface of the metal conductor 304. The metal conductor 304 may be copper, copper alloy, or other conductive metal or alloy thereof. The passivation layer 306 may be, for example, a layer of silicon nitride (SiN) or silicon oxide (SiO). In some embodiments, the metal conductor 304 may be embedded in a semiconductor material 308 (e.g., silicon). In such embodiments, passivation layer 306 may be disposed on a surface of the semiconductor material 308 as well as a surface of the metal conductor 304. The passivation layer 306 may be an unpatterned passivation layer. As used herein, an unpatterned passivation layer may refer to a passivation layer having no voids, or openings, formed therein.

At operation 204, a dielectric layer (e.g., dielectric layer 310 of FIG. 3) may be disposed on a surface of the passivation layer 306. The dielectric layer 310 may be of any composition known in the art and may be applied over the passivation layer in any conventional manner. For example, in some embodiments, the dielectric layer may comprise a polymer (e.g., epoxy-based resin, polyimide, polybenzoxazole (PBO), etc.) that may have a silica filler to provide suitable mechanical properties that meet reliability requirements of the package. The dielectric layer 310 may be disposed on the surface of passivation layer 306, for example, by spin coating and curing the dielectric layer or laminating dielectric layer 310 over passivation layer 306.

At operation 206, vias (e.g., via 312 of FIG. 3) may be formed in the dielectric layer. Via 312 may be formed such that a portion of passivation layer 306 disposed on metal conductor 304 may be exposed through the via 312. The vias may be formed in any conventional manner such as, for example, a photolithography or laser drilling process.

At operation 208, a void may be formed in the passivation layer 306 revealing at least a portion of metal conductor 304. In some embodiments, this void in the passivation layer 306 may be formed through a plasma etching process. In this operation the dielectric layer 310 may be utilized as a mask for forming the void in the passivation layer 306 defined by via 312 formed in the dielectric layer 310. As a result, an edge of the void in the passivation layer 306 may align with, or be defined by, an edge of the via 312 in the dielectric layer 310, as depicted by 314 of FIG. 3. In such embodiments, the via 312 in the dielectric layer 310 and the void in the passivation layer 306 may seamlessly and consistently align.

At operation 210, any oxidation formed on a surface of metal conductor 304, such as copper oxide, for example, may be removed from the surface of the metal conductor 304 exposed by the void formed in the passivation layer 306. This may be accomplished, for example, through a wet etch process. In some embodiments, such a wet etch process may include the application of phosphoric acid, $H_3PO_4$, and hydrogen peroxide, $H_2O_2$, to remove the oxidation. In some embodiments, such a wet etch process may result in an under etch area which may extend beneath a portion of the passivation layer 306 as depicted in the area highlighted by circle 316. In some embodiments, a wet etch process may be unnecessary as there may not be a sufficient amount of oxide on the surface of metal conductor 304 to require such a process. In such embodiments, operation 210 may be omitted.

At operation 212, a barrier material may be disposed on a surface of the dielectric layer 310 and the exposed surface of metal conductor 304 to form a barrier layer (e.g., barrier layer 318 of FIG. 3). Such a barrier layer 318 may include barrier materials such as chrome, titanium, titanium-tungsten, or other suitable material. As can be seen in circle 316, the barrier layer 318 may be open, or not continuous, where an under etch at the sidewall of the metal conductor 304 has occurred. In embodiments where a wet etch process may not have been necessary to remove oxide from a surface of metal conductor 304, no such under etch may occur and the barrier layer 318 may be closed, or continuous. The barrier layer 318 may act to prevent diffusion of one material into a surrounding material. For example, barrier layer 318 may be utilized to prevent copper from diffusing into the dielectric layer 310. The barrier layer 318 may be formed, for example, through a sputtering process.

At operation 214, a seed material may be disposed on a surface of the barrier layer 318 to form a seed layer (e.g., seed layer 320 of FIG. 3). Such seed material may include copper, gold, palladium, or other suitable material. As can be seen in circle 316, the seed layer 320 may be open, or not continuous, just as barrier layer 318 is. As with the barrier layer 318, in embodiments where a wet etch process may not have been necessary to remove oxide from a surface of metal conductor 304, no under etch may occur and the seed layer 320 may be closed, or continuous. The barrier layer 318 may also serve as an adhesion promoter for a later applied metallization over the metal conductor 304 and dielectric material 310. The seed layer 320 may be selected to promote adhesion of a material and may be selected based upon the material that may be applied over a surface of the seed layer 320. The seed layer 320 may be formed, for example, through a sputtering process.

At operation 216 a resist material may be disposed and structured on a surface of the seed layer 320 to form a resist layer (e.g., resist layer 322). The resist layer 322 may act to prevent metal, for example from an electro-plating process, from adhering to portions of the seed layer. At operation 218, a redistribution layer (RDL), such as RDL 120 of FIG. 1, or under bump metallization (UBM) layer 324 may be disposed on a surface of the seed layer 320. The RDL or UBM layer 324 may, in some embodiments, provide a reliable surface on which to apply solder for coupling the IC package with a substrate or circuit board. In other embodiments, additional dielectric and metallic layers may be disposed on the RDL or UBM layer to provide further signal break out. In embodiments, not pictured for the sake of clarity, additional procedures may be carried out after electroplating of the RDL or UBM layer 324. For example, in embodiments portions of resist layer 322 that are exposed after the electroplating of a RDL may be removed. After removal of the portions of the resist layer 322, seed material may be etched utilizing the RDL as a mask followed by etching of the barrier material also utilizing the RDL as a mask. Once these procedures are completed additional dielectric layers and metallic layers may be disposed over any exposed surfaces for further signal breakout or a solder stop layer (e.g., solder stop layer 124 of FIG. 1) may be disposed thereon.

Figure 4:
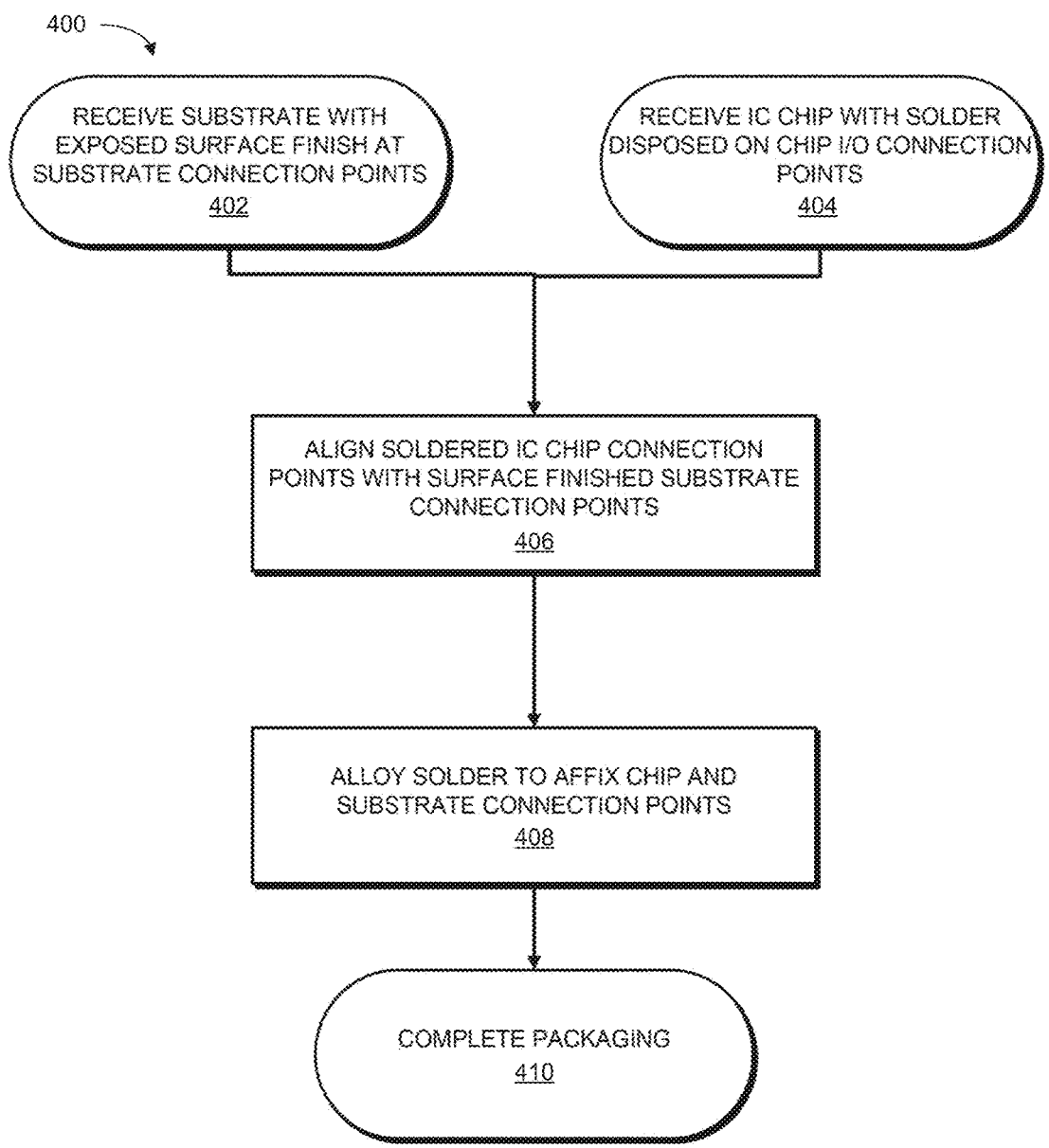
FIG. 4 is an illustrative flow diagram of an assembly process utilizing an integrated circuit package in accordance with an embodiment of the present disclosure.

FIG. 4 is an illustrative flow diagram of an assembly process 400 utilizing an IC package in accordance with embodiments of the present disclosure. Such an IC package may be produced through the illustrative methods described in reference to FIG. 2, described above, and may be depicted in FIG. 3.

Assembly process 400 may begin at operation 402 where a package substrate with exposed surface finish at predetermined substrate connection points may be received. As such, in the illustrative embodiments, no solder resist may be present on the surface of the package substrate and no solder may be placed on the surface finish prior to coupling an IC package to the package substrate.

At operation 404, an IC package may be received with solder bumps disposed on package connection points. In embodiments, the IC package may be represented by the IC package depicted in FIG. 3, above. At operation 406, the connection points of the IC package may be aligned with the connection points of the substrate. The IC package solder may then be alloyed at operation 408 to affix the IC package to the substrate connection points which may complete the packaging 410.

Figure 5:
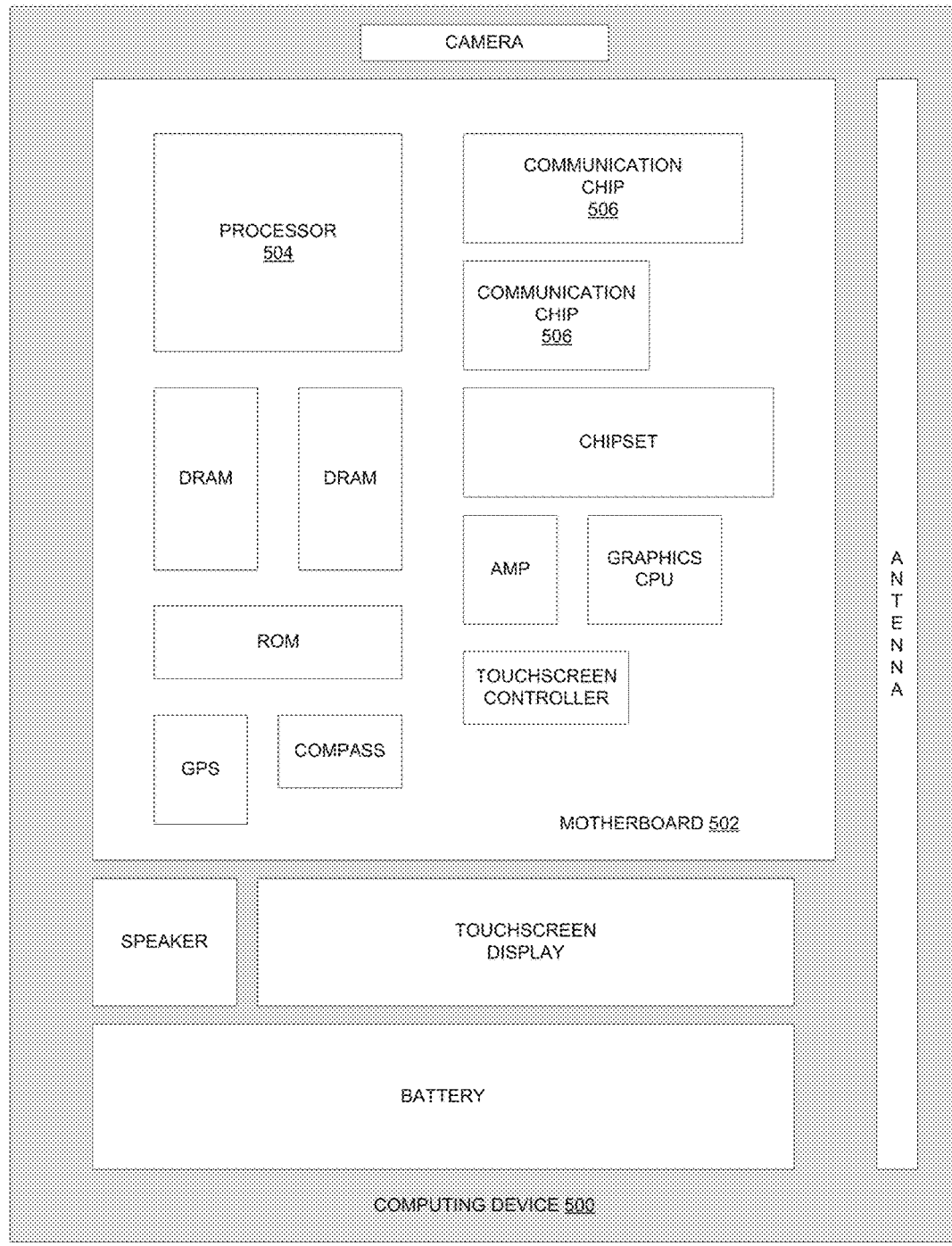
FIG. 5 schematically illustrates a computing device that includes an integrated circuit package, in accordance with some embodiments of the present disclosure.

Embodiments of the present disclosure may be implemented into a system using any suitable hardware and/or software to configure as desired. FIG. 5 schematically illustrates a computing device that includes an IC package as described herein, such as that depicted by FIGS. 1-3. The computing device 500 may house a board such as motherboard 502. The motherboard 502 may include a number of components, including but not limited to a processor 504 and at least one communication chip 506. The processor 504 may be physically and electrically coupled to the motherboard 502. In some implementations, the at least one communication chip 506 may also be physically and electrically coupled to the motherboard 502. In further implementations, the communication chip 506 may be part of the processor 504.

Depending on its applications, computing device 500 may include other components that may or may not be physically and electrically coupled to the motherboard 502. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 506 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other embodiments.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 may be an IC package (e.g., IC package 102 of FIG. 1) incorporated into an IC assembly. For example, the circuit board 130 of FIG. 1 may be a motherboard 502 and the processor 504 may be an IC package 102 as described herein. The processor 504 and the motherboard 502 may be coupled together using package-level interconnects. The term "processor" may refer to any device or portion of a device that processes electronic data from registers and/or memory to transform that electronic data into other electronic data that may be stored in registers and/or memory.

The communication chip 506 may be an IC package (e.g., IC package 102) incorporated into an IC assembly. In further implementations, another component (e.g., memory device or other integrated circuit device) housed within the computing device 500 may be an IC package (e.g., IC package 102) incorporated into an IC assembly.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

EXAMPLES

According to various embodiments, the present disclosure describes a number of examples. Example 1 is method of assembling an integrated circuit package comprising: providing a wafer having an unpatterned passivation layer to prevent corrosion of metal conductors embedded in the wafer; laminating a dielectric material on the passivation layer to form a dielectric layer; selectively removing dielectric material to form voids in the dielectric layer revealing portions of the passivation layer disposed over the metal conductors; and removing the portions of the passivation layer to reveal the metal conductors.

Example 2 may include the subject matter of Example 1, wherein the metal conductor comprises copper and further comprising applying a wet etch process to the metal conductor to remove copper oxide formed thereon.

Example 3 may include the subject matter of Example 2, wherein the wet etch process involves applying phosphoric acid and hydrogen peroxide.

Example 4 may include the subject matter of any one of Examples 1-3, wherein laminating a dielectric material further comprises: spin-coating of the dielectric material on the passivation layer; and curing the dielectric material to harden the dielectric material.

Example 5 may include the subject matter of any one of Examples 1-3, wherein selectively removing dielectric material comprises either a photolithography process or a laser drilling process.

Example 6 may include the subject matter of any one of Example 1-3, wherein removing the portions of the passivation layer further comprises applying a plasma treatment to the portions of the passivation layer to create openings in the passivation layer that reveal the metal conductors, wherein the openings in the passivation layer are defined by the voids in the dielectric layer.

Example 7 may include the subject matter of any one of Examples 1-3, further comprising: depositing a barrier material on the dielectric layer and the metal conductors to create a barrier layer; and depositing a seed material on the barrier layer to create a seed layer.

Example 8 may include the subject matter of Example 7, further comprising: depositing a resist material on the seed layer to form a resist layer; and selectively removing portions of the resist material to form voids in the resist material that reveal the seed layer.

Example 9 may include the subject matter of any one of Examples 1-3, further comprising: depositing a redistribution layer (RDL) or an under bump metallization (UBM) layer in the voids of the resist material.

Example 10 may include the subject matter of Example 9, further comprising: depositing solder onto the RDL or UBM layer to form a solder ball.

Example 11 is an integrated circuit (IC) package comprising: a wafer having a plurality of metal pads embedded therein with a passivation layer formed on, and in direct contact with, the metal pads; a dielectric layer disposed on a surface of the passivation layer, the dielectric layer having a plurality of vias formed therein to reveal a surface of the metal pads through a corresponding plurality of voids formed in the passivation layer, wherein edges of the plurality of vias formed in the dielectric layer respectively define edges of the corresponding plurality of voids formed in the passivation layer.

Example 12 may include the subject matter of Example 11, wherein the metal pads comprise copper.

Example 13 may include the subject matter of Example 12, wherein the metal pads have an under etch sidewall extending radially under the passivation layer forming a void between the passivation layer and a surface of the metal pad Example 14 may include the subject matter of any one of Examples 11-13, further comprising a barrier material disposed on a surface of the dielectric layer forming a barrier layer on the surface of the dielectric layer.

Example 15 may include the subject matter of Example 14, wherein the barrier layer comprises one or more of chrome or titanium.

Example 16 may include the subject matter of Example 14, further comprising a seed material disposed on a surface of the barrier layer forming a seed layer on the surface of the dielectric layer.

Example 17 may include the subject matter of Example 16, wherein the seed layer comprises one or more of copper, gold, or palladium.

Example 18 may include the subject matter of Example 17, wherein the IC package is a fan-in wafer level package or a fan-out wafer level package.

Example 19 is a package assembly comprising: an integrated circuit (IC) package including: a wafer having a plurality of metal pads embedded therein with a passivation layer formed on, and in direct contact with, the metal pads; a dielectric layer disposed on a surface of the passivation layer, the dielectric layer having a plurality of vias formed therein to reveal a surface of the metal pads through a corresponding plurality of voids formed in the passivation layer, wherein edges of the plurality of vias formed in the dielectric layer respectively define edges of the corresponding plurality of voids formed in the passivation layer; and a plurality of input/output (I/O) interconnect structures electrically coupled with the metal pads; and a package substrate including a first side having one or more lands disposed thereon; and a second side disposed opposite to the first side, the second side having one or more electrical routing features disposed thereon, the electrical routing features electrically coupled with the metal pads.

Example 20 may include the subject matter of Example 19, wherein the IC package is a processor.

Example 21 may include the subject matter of Example 20, further comprising one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the package substrate, wherein the package assembly is part of a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method of assembling an integrated circuit package comprising:
   providing a wafer having an unpatterned passivation layer that is disposed on and in direct contact with a metal conductor embedded in the wafer;
   disposing a dielectric material on the passivation layer to form a dielectric layer;
   forming a via in the dielectric layer to expose a portion of the passivation layer disposed over the metal conductors; and
   removing the portions of the passivation layer that is exposed by the forming of the via, to reveal the metal conductor, including using the dielectric layer as a mask to form a void in the passivation layer that comprises the exposed portion of the passivation layer, wherein an edge of a remainder of the passivation layer is to align with an edge of the via in the dielectric layer.

2. The method of claim 1, wherein the metal conductor comprises copper, wherein the method further comprises applying a wet etch process to the metal conductor to remove copper oxide formed thereon.

3. The method of claim 2, wherein the wet etch process involves applying phosphoric acid and hydrogen peroxide.

4. The method of claim 1, wherein disposing a dielectric material further comprises: spin-coating of the dielectric material on the passivation layer; and
   curing the dielectric material to harden the dielectric material.

5. The method of claim 1, wherein forming a via in the dielectric layer comprises using either a photolithography process or a laser drilling process.

6. The method of claim 1, wherein removing the portions of the passivation layer further comprises applying a plasma treatment to the portions of the passivation layer to create openings in the passivation layer that reveal the metal conductor.

7. The method of claim 1, further comprising:
depositing a barrier material on the dielectric layer and the metal conductors to create a barrier layer; and
depositing a seed material on the barrier layer to create a seed layer.

8. The method of claim 7, further comprising:
depositing a resist material on the seed layer to form a resist layer; and
selectively removing portions of the resist material to form voids in the resist material that reveal the seed layer.

9. The method of claim 8, further comprising:
depositing a redistribution layer (RDL) or an under bump metallization (UBM) layer in the voids of the resist material.

10. The method of claim 9, further comprising:
depositing solder onto the RDL or UBM layer to form a solder ball.

* * * * *